(12) United States Patent
Torti et al.

(10) Patent No.: US 6,559,529 B2
(45) Date of Patent: May 6, 2003

(54) PRESS-FIT DIODE FOR UNIVERSAL MOUNTING

(75) Inventors: Aldo Torti, Canavese (IT); Mario Merlin, Canavese (IT); Emilio Mattiuzzo, Cirie (IT)

(73) Assignee: International Rectifier Corporation, El Segundo, CA (US)

(*) Notice: Subject to any disclaimer, the term of this patent is extended or adjusted under 35 U.S.C. 154(b) by 49 days.

(21) Appl. No.: 09/829,809

(22) Filed: Apr. 10, 2001

(65) Prior Publication Data

US 2002/0145189 A1 Oct. 10, 2002

(51) Int. Cl.$^7$ ............................................. H01L 23/06
(52) U.S. Cl. ....................... 257/684; 257/678; 257/687; 257/688; 257/698; 257/699; 257/706; 357/72
(58) Field of Search ................................. 257/678, 687, 257/688, 698, 699, 706

(56) References Cited

U.S. PATENT DOCUMENTS 5,005,069 A * 4/1991 Wasmer et al. ............. 257/687
6,060,776 A * 5/2000 Spitz et al. ................. 257/678

* cited by examiner

*Primary Examiner*—David Nelms
*Assistant Examiner*—Mai-Huong Tran
(74) *Attorney, Agent, or Firm*—Ostrolenk, Faber, Gerb & Soffen, LLP

(57) ABSTRACT

A force-fit diode for high circuit application has a cylindrical constant diameter conductive body which has a tapered top and bottom peripheral edge. An axial conductor extends from one end of the housing. The tapered top and bottom peripheral edges allow the housing to be forced into an opening in the bus, with either the housing bottom or the axial lead being the first to enter the openings.

9 Claims, 3 Drawing Sheets

PRESS-FIT DIODE FOR UNIVERSAL MOUNTING

FIELD OF THE INVENTION

This invention relates to semiconductor device mounting and more specifically relates to a novel housing for a high current press-fit diode which enables its mounting into the top surface or bottom surface of an opening in a flat conductive support body.

BACKGROUND OF THE INVENTION

Press-fit diodes are well-known for high current applications, such as for welders using diodes rated, typically at about 50 amperes. These devices typically have a cylindrical conductive housing with a knurl on their outer diameter and having A coaxial power lead extending from one end to the cylindrical body and insulated therefrom.

A semiconductor die, typically a diode, is suitably mounted within the housing and has one die electrode connected to and supported on the bottom interior of the conductive cylindrical housing, while the other die electrode, on the opposite surface of the die, is connected to the insulated power lead.

The device is mounted by being forced into a thru-opening in a conductive bar so that the exterior cylindrical housing is electrically connected to the conductive bar while the axially extending lead extends away from the plane of the conductive bar and is insulated therefrom.

Press-fit diodes of the prior art are designed so that they can be forced into the thru-opening in the bus bar (or conductive support) with either the bottom of the housing, or the opposite end thereof in a leading direction. That is, they can be forced into the top of the hole in the conductor or into the bottom thereof, respectively. The diode housing has a structure which is tailored to being forced from either the bottom or the top of the conductor. Thus, those which are to be mounted from the bottom of the bus (an arbitrary designation referring to the interior of the diode in such a direction that the axial lead first moves through the hole) have a general taper which narrows from the housing bottom to its top, enabling a force fit into the opening by pressing against the rigid bottom conductive body of the cylindrical housing. However, devices which are to be mounted from the top have a generally right cylindrical wall terminating in a flange, and are mounted by applying downward pressure to the flange to force its housing bottom and tubular wall into high pressure contact with the hole.

The present devices cannot be interchangeably used since the flange of the top mounted device prevents bottom mounting and the taper of the bottom mount device prevents top mounting.

It would be desirable to have a single press fit device which can be both top and bottom mounted.

BRIEF DESCRIPTION OF THE INVENTION

In accordance with the invention, a novel housing structure is provided for a press-fit semiconductor device in which the semiconductor housing body has a flat bottom and a right cylindrical wall which terminates on a top surface. The top surface contains an insulation disk and an outer peripheral edge surface of the cylindrical wall which defines a pressing surface. The axially extending lead extends through the insulation disk. The top and bottom edges of the cylindrical wall are then rounded or tapered so that either the top or bottom of the housing can be located at the bottom or top surface respectively of a hole in conductive mounting bar which is to receive the device. Pressure can then be applied to either the bottom of the housing or at upper peripheral edge portion so that it can be forced fully into the hole.

Thus, the single device can be used for both top mounting and bottom mounting within a bus bar.

DETAILED DESCRIPTION OF THE DRAWINGS

Figure 1:
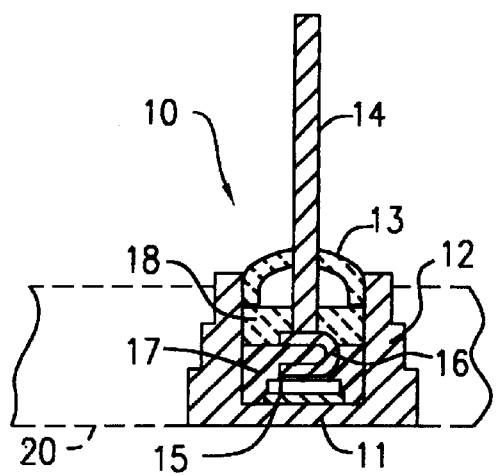
FIG. 1 is a cross-section of a prior art press-fit diode which is adapted for bottom mounting.

Referring first to FIG. 1, there is shown a typical prior art press-fit diode having a conductive housing 10 which is of copper and which has a bottom 11, a cylindrical wall 12 and a top surface of which contains an insulation cap 13. A rigid conductive tubular lead 14 extends through the center of cap 13. The interior of the housing contains a thin flat semiconductor die 15 (a diode or any other desired device) having its bottom electrode soldered or otherwise connected to the top interior surface of base 11. The top electrode of die 15 is connected to the end of lead 14 as through a "C" shaped stress relief conductor 16. The interior volume enclosed by wall 12 may be filled with a flexible insulation compound, for example, rubber volume 17, which is covered and sealed by an epoxy layer 18.

In a typical diode, the interior diameter of wall 12 is 9 mm and its outer diameter at the bottom of base 11 is about 12.8 mm. The axial height of the housing is about 10 mm. The outer surface of wall 12 is knurled and further, is tapered down from bottom to top, such that the diameter of the top of the housing is 12.0 mm, and is tapered or stepped down from a diameter of 12.8 mm at the bottom of base 11. This taper is needed to assist in mounting the device.

Figure 1A:
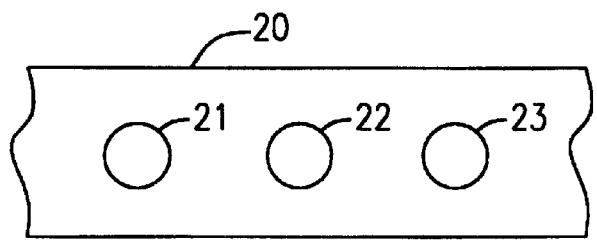
FIG. 1A is a top view of a bus bar having thru-openings to receive press-fit diodes.

As shown in FIG. 1A, a bus bar 20 of aluminum or copper may have spaced mounting holes 21, 22 and 23 which extend through the thickness of bus bar 20 and have a diameter such that they will receive the housing 10 with a low electrical resistance press-fit. The bus bar may have a thickness as shown in dotted lines in FIG. 1 which is less than the total height of housing 10.

To force-fit device 10 in any of holes 21, 22 or 23, the lead 14 is first inserted through its respective hole, from the bottom of bus bar 20, with the reduced diameter at the top of the housing helping to centrally locate the housing within the openings. A force is then applied to the bottom 11 to drive housing 10 forcefully into the hole with a firm low electrical resistance compression, or press-fit.

Note, that the device of FIG. 1 cannot be mounted into the tops of holes 21, 22 or 23 because its larger diameter base would prevent its insertion. A different design is therefore needed for a top loading device, as shown in FIG. 2.

Figure 2:
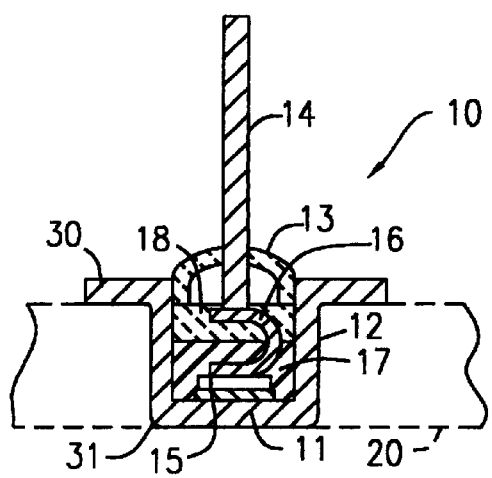
FIG. 2 is a cross-section of a prior art press-fit diode which is adapted for top mounting.

In FIG. 2, those parts which are similar to parts in FIG. 1 have similar identifying numerals. The device of FIG. 2 differs from that of FIG. 1 in that the wall 12 has a constant diameter and is topped by an integral flange 30.

Further, the bottom peripheral edge 31 of housing 10 is rounded. Thus, the device of FIG. 2 can be top mounted into any of holes 21, 22 or 23 of FIG. 1A by locating base 11 above the hole and centering the device by virtue of rounded edge 31, and then forcefully driving the housing 10 into the opening by a force applied to the top of flange 30. Obviously, the flange 30 prevents bottom mounting of the device of FIG. 2.

Figure 3:
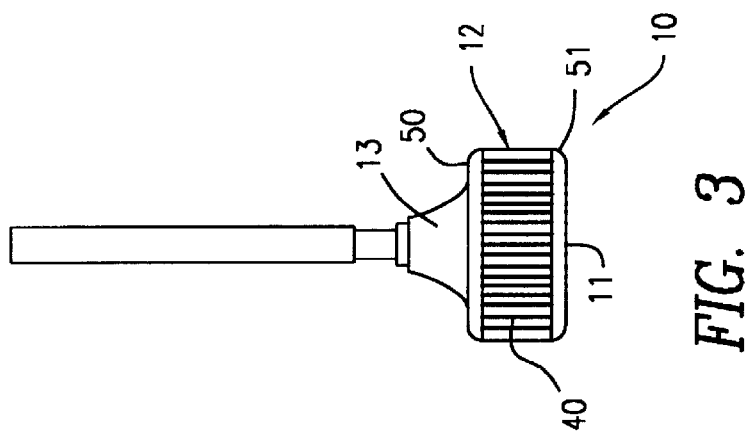
FIG. 3 is a side view of the device of the present invention.
Figure 4:
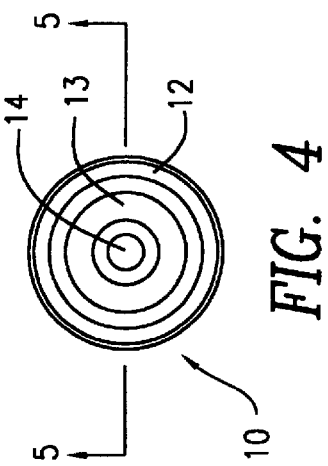
FIG. 4 is a top view of FIG. 3.
Figure 5:
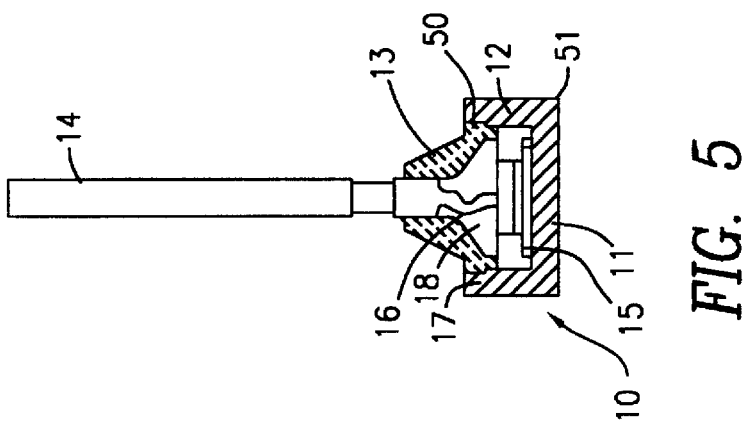
FIG. 5 is a cross-section of FIG. 4 taken across section line 5—5 of FIG. 4.

FIGS. 3, 4 and 5 show the novel press-fit structure of the invention, which can be universally mounted from the top or the bottom of a hole. Those parts which are similar to parts in FIGS. 1 and 2 have similar identifying numerals. FIG. 3 better shows the knurl 40.

Figure 6:
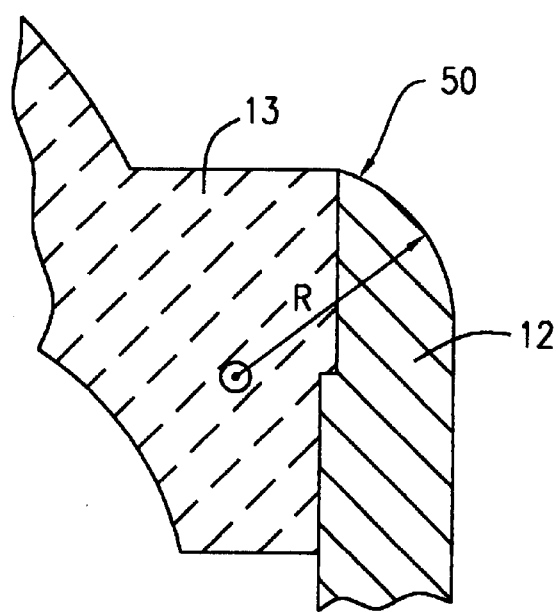
FIG. 6 shows an enlargement of the peripheral edge of the top of the housing wall in FIG. 3, using a rounded finish.
Figure 7:
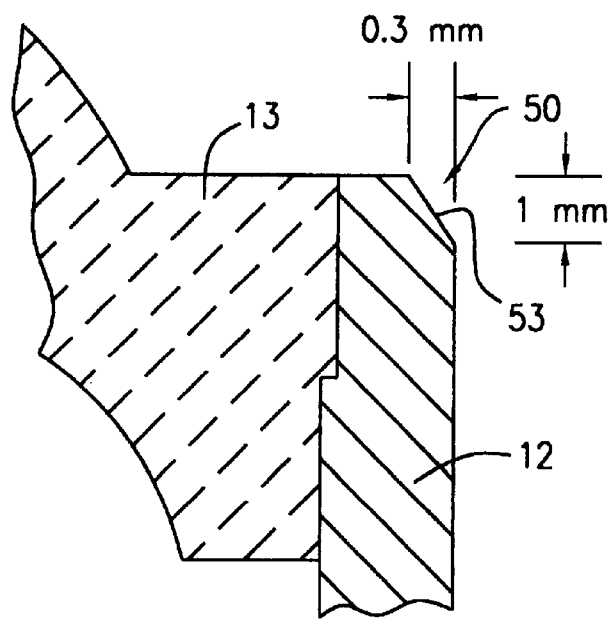
FIG. 7 is a second embodiment of the invention, employing a taper (or chamfer) instead of a rounded profile.

In accordance with the invention both the top peripheral edge 50 and bottom peripheral edge 51 are tapered as by rounding on a radius as shown in FIG. 6, or by a conical taper 53 as shown in FIG. 7. The top and bottom tapers can be identical or could be round and conical respectively. The outer diameter of housing 12 is constant for example, 12.8 mm. The taper, when conical, as in FIG. 7, reduces by 0.3 mm (radius) and has a height of about 1 mm.

It will be readily apparent that the device of FIGS. 6 and 7 can be force-fitted into any of holes 20, 21 or 22 of FIG. 1A from either top or bottom, and thus, have a universal application at little or no extra cost.

Although the present invention has been described in relation to particular embodiments thereof, many other variations and modifications and other uses will become apparent to those skilled in the art. It is preferred, therefore, that the present invention be limited not by the specific, disclosure herein.

What is claimed is:

1. A press-fit semiconductor device which is adapted to be force-fitted into an opening of uniform diameter in a conductive bus bar;

said device comprising a housing having a tubular conductive wall and a conductive base enclosing one end of said tubular wall, and an insulation cap extending across and sealing the other end of said tubular wall;

an elongated lead wire fixed in the center of said insulation cap and extending coaxially with and longitudinally away from said tubular wall; and the upper and lower peripheral edges of said tubular wall and base being tapered to enable the centering of a selected one of the top or bottom respectively of said housing concentrically with an opening in a bus bar before said housing is driven into said opening by pressure applied to said base or to the top of respectively said tubular wall respectively.

2. The device of claim 1 which further includes a semiconductor die mounted within said housing; said semiconductor die having first and second power electrodes connected to said base and to said elongated lead wire respectively.

3. The device of claim 2, wherein at least one of said tapers is a conical taper.

4. The device of claim 3, wherein the outer surface of said tubular wall is knurled.

5. The device of claim 2, wherein at least one of said tapers is a radiused edge.

6. The device of claim 5, wherein the outer surface of said tubular wall is knurled.

7. The device of claim 1, wherein the outer surface of said tubular wall is knurled.

8. The device of claim 1, wherein at least one of said tapers is a conical taper.

9. The device of claim 1, wherein at least one of said tapers is a radiused edge.

* * * * *